United States Patent [19]

Johnson

[11] Patent Number: 4,501,638
[45] Date of Patent: Feb. 26, 1985

[54] LIQUID CHEMICAL PROCESS FOR FORMING CONDUCTIVE THROUGH-HOLES THROUGH A DIELECTRIC LAYER

[75] Inventor: Daniel D. Johnson, Yorklyn, Del.

[73] Assignee: E. I. Du Pont de Nemours and Company, Wilmington, Del.

[21] Appl. No.: 558,308

[22] Filed: Dec. 5, 1983

[51] Int. Cl.³ .......................... C23F 1/02; B44C 1/22; C03C 15/00; B29C 17/08
[52] U.S. Cl. ..................................... 156/644; 29/853; 29/882; 156/150; 156/630; 156/634; 156/645; 156/652; 156/656; 156/668; 156/902; 204/24
[58] Field of Search ............... 156/629, 630, 634, 644, 156/645, 652, 655, 656, 659.1, 661.1, 902, 150, 668; 29/852, 853, 874, 882, 885; 174/68.5; 427/96, 97; 204/15, 24, 26; 430/317, 318

[56] References Cited

U.S. PATENT DOCUMENTS

| | | | |
|---|---|---|---|
| 3,557,446 | 1/1971 | Charschan | 29/625 |
| 3,969,815 | 7/1976 | Hacke et al. | 29/265 |
| 4,184,909 | 1/1980 | Chang et al. | 156/643 |
| 4,289,573 | 9/1981 | Economy et al. | 21/306 |
| 4,319,708 | 3/1982 | Lomerson | 228/111 |

OTHER PUBLICATIONS

J. W. Coburn, "Plasma Etching", 6 pages.
CPI No. H-82-8750-N, Prior Art Search Report, D. J. Pinto, pp. 3-8.

*Primary Examiner*—William A. Powell

[57] ABSTRACT

A conductive through-hole hole is formed by liquid chemically etching a hole completely through a dielectric sandwiched between conductors and by deforming at least one conductor which has been undercut during the etching.

13 Claims, 9 Drawing Figures

LIQUID CHEMICAL PROCESS FOR FORMING CONDUCTIVE THROUGH-HOLES THROUGH A DIELECTRIC LAYER

BACKGROUND OF THE INVENTION

The present invention is directed to an improved process for forming conductive through-holes through a dielectric, i.e., an insulating layer, sandwiched between two conductive layers. The process is particularly useful in formation of printed circuit boards.

U.S. Pat. No. 3,969,815 discloses a process for providing an electrical interconnection of two metal layers positioned on opposite sides of a substrate. A hole is initially drilled or bored completely through the two metal layers and the intermediate insulating layer. The hole in the insulating layer is enlarged by a selective etching process which only etches the insulating layer to form an enlarged annular hole in the insulating layer which undercuts the metal layer portions. Thereafter these overhanging metal portions on opposite sides of the insulating layer are deformed by pressure to contact or almost contact one another. The deformed metal portions are coated by galvanic metal which is overcoated by a thin layer, preferably tin, to form a conductive path.

SUMMARY OF THE INVENTION

The present invention is directed to a process for making an electrically conducting path in a dielectric layer sandwiched between two conductive layers comprising
  (a) forming a hole completely through one of the conductive layers without substantially removing material from the dielectric layer;
  (b) through said hole chemically etching the dielectric layer using a liquid capable of etching said dielectric layer whereby a pathway is formed completely through the dielectric layer between the conductive layers and whereby the conductive layer is undercut of dielectric material adjacent to the hole in said conductive layer;
  (c) deforming the conductive layer which has been undercut toward the other conductive layer, and
  (d) forming an electrical conducting path between the two conductive layers through the pathway.

DETAILED DESCRIPTION OF THE INVENTION

Figure 1A:
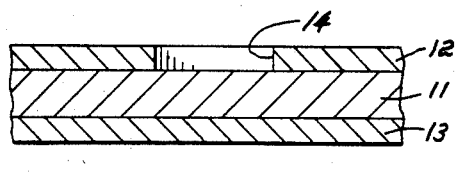
FIG. 1A is a cross-sectional view of a composite article of an electrically conductive layer, a dielectric layer and an electrically conductive layer with a hole through one conductive layer.

The present invention is particularly adapted for forming a conductive through-hole, and particularly a great number of precisely located through-holes, through a dielectric layer sandwiched between two electrically conducting materials. Generally the electrically conductive layers are metal, preferably copper, while the dielectric is generally an electrically insulating polymer.

Composites of two layers of an electrical conductive material separated by a dielectric are conventional starting materials for forming circuit boards and are suitable herein. Generally the dielectric layer will be at least one mil in thickness and the conductive layer will be 0.7 to 2.8 mil thick, e.g., copper foil, although both thinner and thicker layers can be used. The materials of construction of the insulating layer are not critical except that they can be removed by liquid chemical etching techniques.

In the present invention hole formation is necessary in one of the conductive layers without any substantial removal of material of the dielectric layer. Hole formation in a conductive layer preferably employs chemical etching which is well-known in the formation of printed circuits. An example of such chemical etching involves lamination of a negative acting photosensitive film to the conductor surface which does not face the dielectric layer, exposing the photosensitive polymer to actinic radiation through a photomask, developing and removing unexposed photosensitive polymer to expose portions of the metal layer and thereafter chemically etching completely through the thickness of the exposed conductive layer. This chemical etching step removes little or no material from the dielectric polymer layer. A suitable process is disclosed in Celeste U.S. Pat. No. 3,469,982. Positive working photopolymers with processing techniques well known in the art can likewise be used, e.g., Cohen and Heiart U.S. Pat. No. 4,193,797.

The diameter of the holes chemically etched in the conductive layer can be small, e.g., in the range of 25 to 250 microns. Also chemical etching of the conductive layer can form a great number of holes simultaneously, e.g., hundreds or thousands of holes can be easily formed in a composite blank for a circuit board of a dimension of 12 inches times 12 inches. In comparison, drilling or punching of a hole is a laborious process with an increased chance of error as the number of holes increases. Also drilling or punching of a hole generally results in a hole diameter not smaller than 325 microns.

The materials of construction of the dielectric layer are not critical except that they can be etched by a liquid chemical etchant. Such etchants and etching techniques by which a liquid can etch selectively through a dielectric material are well-known in the art. This etchant will not cause a substantial removal of the conductive material. Suitable etchants include those disclosed in U.S. Pat. No. 3,969,815, e.g., a sulfuric acid solution can be used for polyester and epoxide resins while a caustic alcoholic solution is suitable for a polyimide. Any solvent capable of etching away areas of the polymer not masked by the conductive metal without any deleterious effect on the metal may be used. Examples of solvents are tetrachloroethylene, methyl chloroform, mixture of 90% tetrachloroethylene and 10% isobutyl alcohol (by volume), and chromic acid.

Turning to the Figures, the embodiment of FIG. 1A shows a composite with a hole 14 chemically etched in conductive layer 12. The etchant for the conductive layers has not significantly attacked the dielectric layer 11.

Figure 1B:
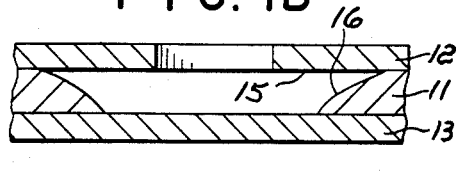
FIG. 1B is a cross-sectional view of the article of FIG. 1A with the addition of a hole formed through the dielectric layer by etching.

Thereafter a selective liquid etching process is employed to chemically etch the dielectric layer through the hole formed in the conductive layer. The composite article formed thereby is shown in FIG. 1B wherein an overhanging portion 15 is present in the conductive layer 12. The wall dielectric construction 16 is angular due to the etching process whereby the liquid etchant removes material completely through the thickness of the dielectric layer while at the same time etching the dielectric in a lateral direction in formation of a through-hole.

Figure 1C:
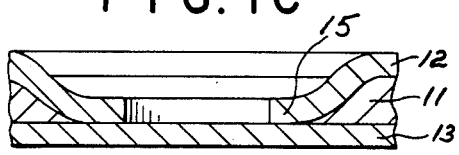
FIG. 1C is a cross-sectional view of the article of FIG. 1B except the electrically conductive layer has been deformed into the hole in the dielectric layer.

Upon completion of the hole completely through the dielectric, the undercut conductive layer 15 is deformed to contact or come in close contact with layer 13. A suitable method is direct pressure application on the undercut conductive portions. This article embodiment is shown in FIG. 1C wherein the conductive portion 15 covers the etched dielectric surface 16. Thereafter if necessary, the deformed electrically conductive material may be electrolytically plated with a metal such as copper or soldered or welded to complete or ensure an electrically conductive path through the dielectric layer. The formation of through-holes in accordance with the present technique allows use of thin conductive layers, e.g., of 3.0 mils or less which cannot be used with drilling techniques in which a hole is drilled through the dielectric layer since the drilling would destroy the integrity of the second conductor, i.e., a hole would be formed in this second conductive layer.

Figure 2A:
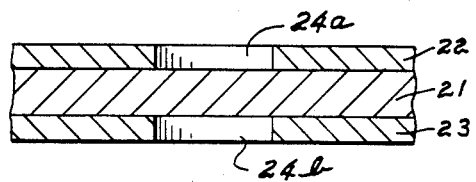
FIG. 2A is a cross-sectional view of a composite article of an electrically conductive layer, a dielectric layer and an electrically conductive layer with a hole through each of the conductive layers.
Figure 2B:
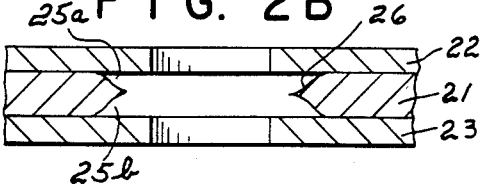
FIG. 2B is a cross-sectional view of the article of FIG. 2A with the addition of a hole formed in the dielectric layer by etching.
Figure 2C:
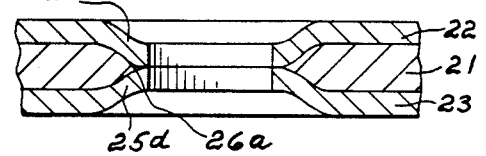
FIG. 2C is a cross-sectional view of the article of FIG. 2B except the electrically conductive layers have been deformed into the hole in the dielectric layer.

In an alternate embodiment of the present invention shown in FIGS. 2A, 2B and 2C, holes 24a and 24b are formed in both conductive layers 22 and 23 opposite one another rather than in one conductor shown in FIG. 1A. Except for this change the same process steps are employed except etching of the dielectric can proceed simultaneously from opposite surfaces. The metal conductors are undercut at 25a and 25b. With simultaneous opposite etching of the dielectric two distinct angular wall portions are present in the dielectric wall 26. After completion of the chemical etching of the dielectric, the undercut conductive portions are deformed toward the other respective conductive layer to make contact or approximate contact. FIG. 2C illustrates the compressed conductive portions 25c and 25d in contrast with the dielectric surface 26a. Thereafter, if desired, electrolytic plating, soldering or welding may take place to ensure electrical conductivity.

Figure 3A:
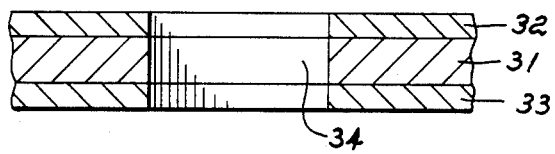
FIG. 3A is a cross-sectional view of a composite article of an electrically conductive layer, a dielectric layer and an electrically conductive layer with a hole through the composite.
Figure 3B:
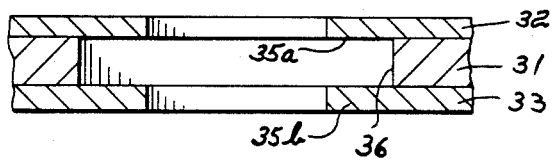
FIG. 3B is a cross-sectional view of the article of FIG. 3A with the addition of an enlarged hole in the dielectric layer.
Figure 3C:
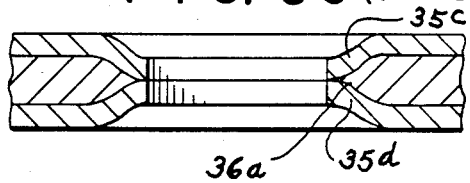
FIG. 3C is a cross-sectional view of the article of FIG. 3B except the electrically conductive layers have been deformed into the hole.

The embodiment of FIGS. 3A, 3B and 3C illustrate the article and through-holes formed following the teachings of U.S. Pat. No. 3,969,815. A composite of an electrically conductive layer 32, a dielectric 31 and an electrically conductive layer 33 has a hole 34 drilled or punched therein which is shown in FIG. 3A. In the FIG. 3B embodiment, a liquid chemical etchant has been used to selectively etch away the dielectric layer to form a wall 36 which is substantially planar with electrically conductive overhang portions 35A and 35B. In the FIG. 3C embodiment deformation of these conductive layers into the hole in the dielectric has taken place to form compressed, pinched conductive portions 35c and 35d with dielectric surface portion 36a bowed outwardly due to the force of the deformation of the conductive layers.

With the prior art drilling operation, hole formation takes place in both conductors unlike the FIG. 1A, FIG. 1B and FIG. 1C embodiments where only one conductor has any hole formed therein. Foils and other thin sheets can be used for the conductor which retains its integral shape. Also in comparison with the prior art, the article of the FIG. 1C and FIG. 2C embodiments can have less stress for the conductive portions in the passageways. Deformation of the dielectric takes place in formation of the conductive passageway shown in FIG. 3C of the prior art which can cause greater residual stress than the embodiments of the present invention. Also generally the smallest hole that can be practically formed by mechanical drilling is of the order of 325 microns. In contrast with a chemical etching technique preferred in the present invention the hole in the conductive layer can be considerably smaller, e.g., in the range of 25 to 250 microns. Of course if necessary larger holes can be formed.

The process of the present invention is particularly adapted to formation of multiple layers of circuitry. Illustratively after completion of a conductive path through the dielectric layer a new dielectric layer can be applied to at least one of the conductive layers and a new conductive layer can be applied to this dielectric layer. Application of the new dielectric and new conductive layers can be undertaken simultaneously to the article containing the electrically conductive throughhole, e.g., a dielectric layer and conductive layer compositive are laminated onto the conductive layer previously processed in formation of at least one throughhole. Thereafter a conductive path is formed through the newly applied dielectric layer in accordance with the technique previously disclosed.

In the following examples all parts and percentages are by weight unless otherwise indicated.

EXAMPLE 1

A heat curable polymer was coated on a 0.001 inch (0.0025 cm) polyethylene terephthalate sheet from 82% methylene chloride/18% ethyl cellosolve (47% solids), dried, and laminated to a polypropylene cover sheet. The dried polymer of 3.0 mils (0.0076 cm) thickness was of the following formula:

| | |
|---|---|
| Copolymer of styrene-butadiene/ acrylonitrile/methyl methacrylate | 23.6% |
| Methyl methacrylate (95.5)/ ethyl acrylate (4.5) copolymer | 8.0 |
| Di-(3-acryloxy-2-hydroxypropyl ether of Bisphenol A | 15.1% |
| Pentaerythritol triacrylate | 25.0% |
| Benzophenone | 5.3% |
| Bis acryloxy ethyl tetrabromo Bisphenol A | 10.0% |
| 4,4'bisdimethyl amino- benzophenone | 0.3% |

-continued

| | |
|---|---|
| Monastral ® Green Pigment | 0.5% |
| 3-Mercapto-1,2,4-triazole | 12.0% |

The polypropylene cover sheet was removed and the tacky photopolymer was laminated to a piece of copper clad glass epoxy laminate. The polyethylene terephthalate sheet was removed and a piece of 1.0 mil (0.0025 cm) copper foil was laminated to the polymer coated copper clad substrate. Small 10 mil (0.025 cm) holes were formed in the copper foil using Riston ®1210 and the process described in U.S. Pat. No. 3,469,982. The sample was immersed in an ultrasonic cleaner filled with methylchloroform for 45 seconds which removed polymer from the holes leaving a copper overhang of about 5 mils (0.0127 cm). The sample was rinsed in water to stop development and heat cured at 150° C. for 16 hours.

After development and curing, the copper/polymer/copper sandwich was placed in a laminating press and covered with a rubber pad that had a regular pattern of 4 mil posts (17,000/sq.in.). The press was pressurized to 1000 psi to collapse the copper overhangs onto the lower copper layer. The copper/polymer/copper sandwich was electroplated for 15 minutes at 30 amps/ft$^2$ in an acid copper sulfate plating bath.

The top of the plated sandwich was covered with Riston ®1210 and 70 mil (0.1778 cm) pads were etched around the collapsed and plated holes using circuit etching techniques described in U.S. Pat. No. 3,469,982. The vias were electrically conductive.

EXAMPLE 2

A heat curable polymer composition was coated on a 1 mil (0.0025 cm) silicone treated polyethylene terephthalate film from methylene chloride (35% solids) and dried to a thickness of 2.0 mils (0.05 cm). The polymer composition had the following constituents.

| Diacrylate ester of Bisphenol A | 15.0% |
|---|---|
| epoxy resin (viscosity of 1,000,000 cp at 25° C., sp. grav. = 1.2 | |
| pentaerythritol triacrylate | 10.0% |
| trimethylolpropane triacrylate | 15.0% |
| Ethyl acrylate (56)/methyl methacrylate (37)/acrylic acid (7) copolymer (mol. wt. 260,000, Acid No. 76-85) | 25.0% |
| Hexamethoxymethylmelamine | 9.0% |
| Methylmethacrylate/butadiene/styrene copolymer (sp. grav. - 1.0) | 20.0% |
| Benzophenone | 5.0% |
| 4,4'bisdimethylamino benzophenone | 0.3% |
| Monastral Green Pigment | 0.7% |
| [4-[Bis-[p-(dimethylamino)-phenyl]methylene]-2,5-cyclohexadiene-1-ylidene-N—methanium chloride | 0.015% |

The polymer composition was laminated to a (7.62 cm × 7.62 cm) piece of copper clad glass epoxy laminated. The polyethylene terephthalate film was removed and a 1.0 mil (0.0025 cm) thick copper foil was laminated to the polymer composition. 10 mil (0.025 cm) holes were formed in the copper foil using the process described in Example 1. The assembled sandwich was immersed in a methylchloroform spray to remove polymer composition from the holes and to undercut the holes in the copper foil by about 3 mils (0.0076 cm) in all directions. After development the package was thermally cured by baking for one hour at 150° C.

The copper foil overhangs were then individually collapsed using a small metal probe.

The part may then be electroplated in a standard acid copper electroplating bath to further enhance the interconnection caused by collapsing the overhanging copper foil onto the copper clad laminate.

The top copper foil may then be covered with Riston ®1210 and processed as described in Example 1 to define the desired circuit pattern.

The process steps can be repeated to build multilayer circuit boards with blind interconnections.

EXAMPLE 3

A film is coated on copper clad glass epoxy laminate from methylene chloride (35% solids). After drying the film is 2 mils (0.005 cm) thick and has the following composition:

| | |
|---|---|
| (methyl methacrylate (95.5)/ ethyl acrylate (4.5) copolymer | 50 parts |
| (CH$_2$—CH—CH$_2$—O—⟨phenyl⟩)$_2$ (epoxy structure) | 45 parts |
| CH—CH—(—⟨phenyl⟩—O—CH$_2$—CH—CH$_2$)$_2$ (epoxy structure) | |
| Dicyanodiamine N≡C—NH$_2$—C(=NH)—NH$_2$ | 5 parts |

A one mil (0.0025 cm) thick copper foil is heat laminated to the coating. Ten mil (0.025 cm) holes are etched in the top copper foil using techniques known to those familiar with the art of circuit board manufacturing. The sample board is immersed in an ultrasonic cleaner filled with methyl chloroform for 1 minute to remove the polymer-epoxy coating leaving 5 mil (0.0127 cm) copper overhangs. A 10 mil (0.025 cm) thick cardboard sheet and a 40 mil (0.10 cm) silicone rubber pad are placed on top of the developed sample. A pressure of 20,000 psi is applied with a laminating press to collapse the copper overhangs onto the underlying copper clad glass epoxy. The sample is cured at 150° C. for 1 hour. The sample is electroplated with ½ mil (0.00127 cm) of copper using conventional electroplating techniques to insure good electrical connections. Finally, the top copper foil is patterned with the desired circuit pattern using standard circuit etching techniques to complete the circuit board.

EXAMPLE 4

A thermally curable polymer was coated from methylene chloride (35% solids) onto a polyethylene terephthalate film. The polymer had the following composition:

| Component | % |
|---|---|
| Diacrylate ester of bis-phenol A | 20 |

| Component | % |
| --- | --- |
| Pentaerythritol triacrylate | 20 |
| Methyl methacrylate (95.5)/ethyl acrylate (4.5) copolymer | 6 |
| Styrene-butadiene/acrylonitrile/methyl methacrylate copolymer | 27 |
| Benzophenone | 4.0 |
| 4,4'bis dimethyl amino benzophenone | 0.5 |
| Clay (0.5 micron) | 22.0 |
| Monastral Green Pigment | 0.5 |

The dried coating was 0.002 inch (0.0051 cm) thick. Two layers (0.004 inch, i.e., 0.0102 cm) were laminated to a piece of copper clad glass epoxy. The coating sheet was removed after each lamination. A piece of 0.001 inch (0.00254 cm) copper foil was laminated to the tacky polymer to form copper/polymer/copper clad laminate structure.

A pattern of 0.01 inch (0.0254 cm) holes was formed in the laminated copper foil using Riston ®1210 and the process described in Example 1. The part was then immersed in methyl chloroform in an ultrasonic cleaner for 1 minute to remove the polymer from the holes leaving a copper overhang of at least 0.005 inch (0.0127 cm). The part was cured thermally for 8 hours at 150° C. After curing, the part was placed in a laminating press, hole side up, and covered with a dimpled rubber pad sheet as described in Example 1. A pressure of 1,000 psi was applied for 10 seconds to collapse the copper foil overhang so it touches the copper laminate. The part was removed from the press, and electroplated in a standard acid copper electroplating bath to enhance the connection. The side of the part with the collapsed overhang was then covered with Riston ®1210 and processed as described in Example 1 to define the desired circuit pattern.

EXAMPLE 5

Example 4 was repeated with the following exception:

The copper foil overhangs were individually collapsed with a small metal probe.

What is claimed is:

1. A process for making an electrically conducting path in a dielectric layer sandwiched between two conductive layers comprising
   (a) forming a hole completely through one of the conductive layers without substantially removing material from the dielectric layer;
   (b) through said hole etching the dielectric layer using a liquid capable of etching said dielectric layer whereby a pathway is formed completely through the dielectric layer between the conductive layers and whereby the conductive layer is undercut of dielectric material adjacent to the hole in said conductive layer;
   (c) deforming the conductive layer which has been undercut toward the other conductive layer, and
   (d) forming an electrical conducting path between the two conductive layers through the pathway.

2. The process of claim 1 where a hole is formed only in one conductive layer in step (a).

3. The process of claim 2 wherein the conductive layer which does not have a hole formed therein in step (a) has a thickness not greater than 3.0 mils.

4. The process of claim 2 wherein the conductive layer is copper.

5. The process of claim 1 wherein holes are formed in the conductive layers on opposite sides of the polymeric dielectric layer in step (a) and the dielectric layer is chemically etched through the opposite holes in the conductive layers in step (b).

6. The process of claim 1 wherein the electrical connection in step (d) is formed by contact of the two conductive layers.

7. The process of claim 1 wherein the formation of the electrical connection includes application of an electrically conductive material to the conductive layer in the pathway.

8. The process of claim 1 wherein a plurality of holes are simultaneously formed in step (a) and a plurality of pathways are simultaneously formed in step (b).

9. The process of claim 1 wherein the insulating layer has a thickness of at least one mil.

10. The process of claim 1 wherein the etching of step (a) is by chemical etching.

11. The process of claim 1 wherein steps (c) and (d) are performed substantially simultaneously.

12. The process of claim 1 wherein after step (d) a new dielectric layer and a new insulating layer are applied to one of the conductive layers with the new dielectric layer sandwiched between two conductive layers followed by the step of
   (a) forming a hole completely through the new conductive layer without substantially removing material from the new dielectric layer;
   (b) through said hole etching the new dielectric layer using a liquid capable of etching said new dielectric layer whereby a pathway is formed completely through the new dielectric layer between the conductive layers and whereby the new conductive layer is undercut of dielectric material adjacent to the hole in said new conductive layer;
   (c) deforming the new conductive layer which has been undercut toward the other conductive layer, and
   (d) forming an electrical conducting path between the two conductive layers through the pathway.

13. A process for making an electrical conducting path through a dielectric layer sandwiched between two copper conductive layers comprising:
   (a) forming a hole completely through one copper conductive layer by chemical etching without substantially removing material from the dielectric layer or the second copper layer;
   (b) etching the polymeric dielectric layer through said hole using a liquid etchant capable of etching said dielectric layer whereby one copper layer is undercut of dielectric material adjacent the hole in the copper layer;
   (c) deforming the undercut copper layer toward the second copper layer;
   (d) forming an electrical connection between the two copper layers through the pathway.

* * * * *